United States Patent [19]
Salnick et al.

[11] Patent Number: 5,485,491
[45] Date of Patent: Jan. 16, 1996

[54] ONLINE DIAGNOSTIC SYSTEM FOR ROTATING ELECTRICAL APPARATUS

[75] Inventors: Richard E. Salnick, Monroeville; Mark H. Emerson, Murrysville; Paul C. Gaberson, Forest Hills; Charles D. Bice, Clinton Township, all of Pa.

[73] Assignee: Westinghouse Electric Corporation, Pittsburgh, Pa.

[21] Appl. No.: 221,630

[22] Filed: Mar. 31, 1994

[51] Int. Cl.⁶ .................................................. G21C 17/00
[52] U.S. Cl. .................. 376/245; 376/249; 376/258; 376/255; 376/259; 376/215; 376/216; 376/203; 376/247
[58] Field of Search .................................. 376/245, 249, 376/247, 258, 255, 259, 215, 216, 203; 364/184, 554, 579, 580; 73/168

[56] References Cited

U.S. PATENT DOCUMENTS

| | | | |
|---|---|---|---|
| 4,413,474 | 11/1983 | Moscrip | 60/517 |
| 4,523,451 | 6/1985 | Boster | 73/37.6 |
| 4,564,500 | 1/1986 | Keady | 376/463 |
| 4,737,775 | 4/1988 | Takuda et al. | 340/647 |
| 4,896,101 | 1/1990 | Cobb | 324/73.1 |
| 5,038,893 | 8/1991 | Willner et al. | 184/7.4 |
| 5,107,447 | 4/1992 | Ozawa et al. | 364/551.01 |
| 5,287,875 | 2/1994 | Otani | 137/15 |
| 5,329,465 | 7/1994 | Arcella et al. | 364/551.01 |

OTHER PUBLICATIONS

Robert L. Osborne et al., On–Line Diagnosis of Instrumentation Through Artificial Intelligence, pp. 1–6.
I. J. King, Dr. et al., Turbine Generator On–Line Diagnostic System, pp. 1–6, Oct., 1987, ASME/IEEE.
M. A. Moradian et al., Generator Artificial Intelligence Diagnostics On–Line Experience, pp. 1–19, 1990, EPRI.
Robert L. Osborne et al., On–Line Diagnostics and Monitors for the 1990s, pp. 29–36, 1991, PWR—vol. 13, Design, Repair, and Refurbishment of Steam Turbines.
Robert F. Gray et al., User Interface Graphically Improves Generator AI Diagnostics, pp. 16–20, Jul., 1991, IEEE Computer Applications in Power.

*Primary Examiner*—Donald P. Walsh
*Assistant Examiner*—Meena Chelliah

[57] ABSTRACT

An online system for diagnosing operability of a rotating electrical apparatus includes sensors producing electrical variables corresponding to operating conditions of the apparatus, data converters for converting the electrical variables to digital values, a comparator for comparing the values to corresponding predetermined baseline values of the apparatus and producing a corresponding comparison value, and a signalling mechanism for outputting signals related to a period of predicted operability of the apparatus whenever the comparison value exceeds a corresponding predetermined deadband value. The operating conditions may be non-electrical operating conditions, such as a condition of a lubrication system or a bearing of the apparatus. Alternatively, the sensors may sense electrical insulation non-thermal parameters during operation of the apparatus, in order to produce signals related to the operability of an insulator of the apparatus. The system may have a local processor for performing the comparisons and signaling. Alternatively, the system may include an intermediate data storage and communication mechanism for storing and communicating the sensed values to a remote processor. The processor may also trend the values with respect to time and determine a derivative of a sensed value. The apparatus may be a motor operating in a hazardous environment, such as a reactor coolant pump (RCP) motor operating in a nuclear containment vessel.

33 Claims, 9 Drawing Sheets

ONLINE DIAGNOSTIC SYSTEM FOR ROTATING ELECTRICAL APPARATUS

BACKGROUND OF THE INVENTION

1. Field of the Invention

This invention is directed to a diagnostic system for a rotating electrical apparatus, and more particularly to an online system for diagnosing the condition and maintenance requirements of an operational motor.

2. Background of Information

Large motors require periodic preventive maintenance to ensure reliable and efficient performance over an operational lifetime. The requisite maintenance period is a function of a specific design of a particular motor. Reactor coolant pump (RCP) motors used in nuclear power plants, for example, are typically inspected annually, during refueling outages, and are disassembled for inspection or refurbishment every five to ten years. Significant time and field effort are required to disassemble such motors and perform the requisite inspections.

A set of motors having an identical design are, nevertheless, different in terms of a variety of factors such as normal manufacturing tolerances, operating history and environment, and quality of maintenance. A pre-specified operating period, before motor inspection or maintenance, is an informed estimate of the appropriate operational schedule for a typical motor under recommended operating conditions. In some cases, the pre-specified operating period may be too long (e.g., where recommended motor operating parameters have been exceeded) and, hence, inefficient operation may result at the end of the period. In other cases, the prespecified operating period may be too short (e.g., where the motor has been relatively lightly loaded) and, therefore, unnecessary costs associated with outage time, manpower and material will be expended. Furthermore, where a RCP motor is located within a nuclear containment vessel, unnecessary human exposure to radiation would result.

There is a need, therefore, for a system which accurately diagnoses the condition of an operational rotating electrical apparatus.

There is a more particular need for such a system which accurately diagnoses the maintenance or inspection requirements of the operational rotating electrical apparatus.

SUMMARY OF THE INVENTION

These and other needs are satisfied by the invention which is directed to an online system for diagnosing operating conditions of a motor, in order to determine when motor maintenance is required. Motor sensors are provided which monitor various physical parameters (e.g., non-electrical or insulation-related conditions) and produce corresponding electrical signals. Signal converters transform the electrical signals to corresponding digital values. These values are collected by a processor which compares the values, or a trend of the values, with predetermined baseline values, or trends, associated with a newly manufactured or refurbished motor. The processor then makes recommendations for a motor maintenance interval, in order to provide optimum motor performance and availability at minimum cost and downtime. The motor maintenance interval is a specific time or, alternatively, a more general time, such as the time of the next scheduled refueling outage.

In the case of a RCP motor within a nuclear containment vessel, an intermediate data storage device collects the digital values corresponding to the electrical signals and communicates the digital values to a processor which is remotely located (e.g., beyond a biological barrier, beyond the containment vessel, at an off-site location, etc.) from the RCP motor.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

Figure 1:
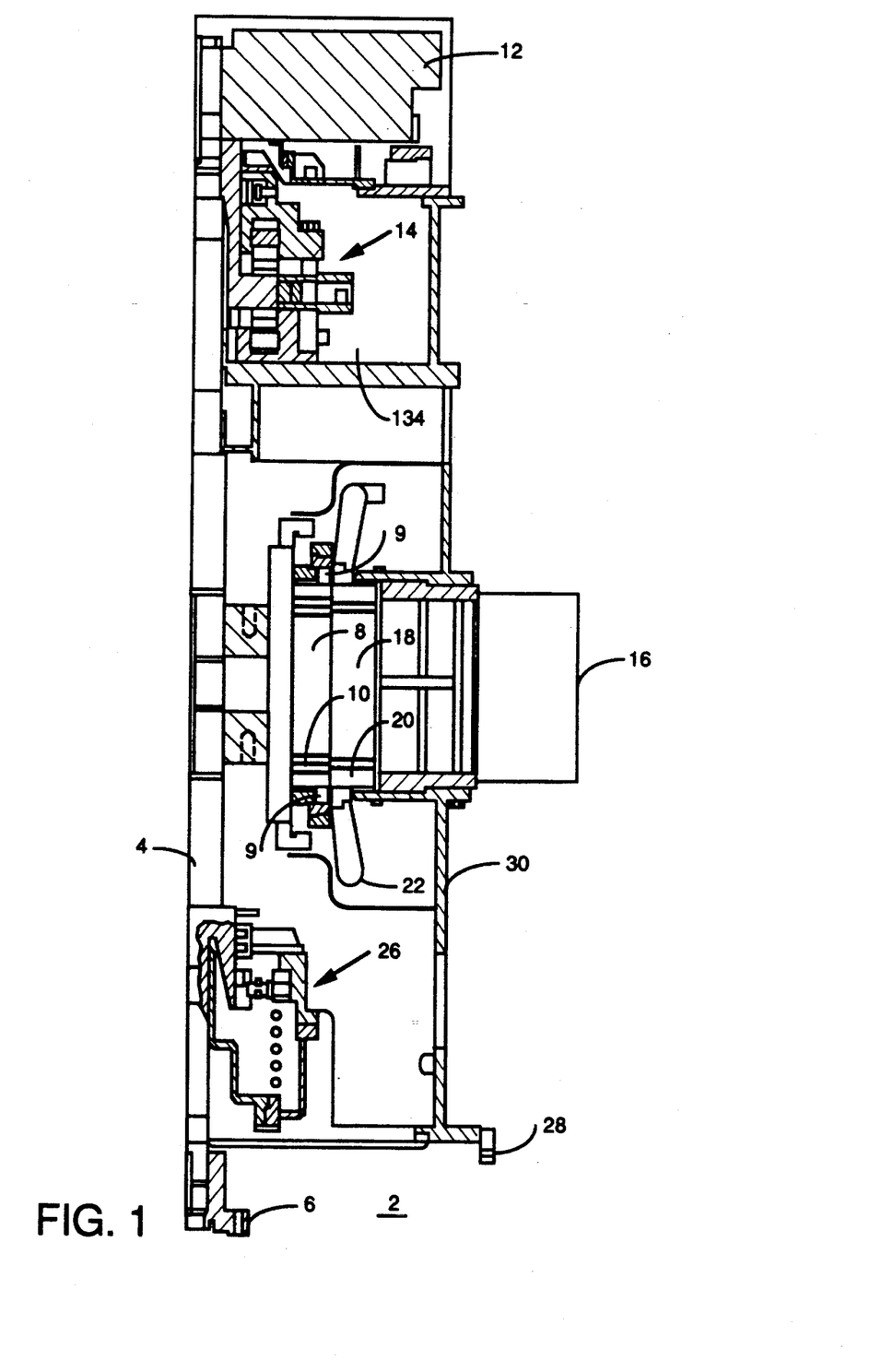
FIG. 1 is a vertical cross-sectional view of a right half of a reactor coolant pump (RCP) motor.

FIG. 1 illustrates a conventional reactor coolant pump (RCP) motor 2 to which the invention is applied. It being understood that the invention is applicable to any type of rotating electrical apparatus (e.g., a generator) operating in any environment including a hazardous environment, such as a nuclear containment vessel. The exemplary RCP motor 2 includes a central rotatable shaft 4 having a drive shaft coupling 6 at one end of the shaft 4 for connection to a RCP (not shown), a rotor 8 having rotor windings 9 and a rotor core 10, and a flywheel 12. The exemplary flywheel 12 is located at the opposite end of the shaft 4 with respect to the drive shaft coupling 6. The RCP motor 2 further includes an upper bearing assembly 14, an air cooler 16, a stator 18 having a stator core 20 and stator windings 22, and a lower radial bearing assembly 26, all contained in a housing 30 having a motor mounting flange 28. Alternatively, the RCP motor 2 may not have the air cooler 16.

Figure 2A:
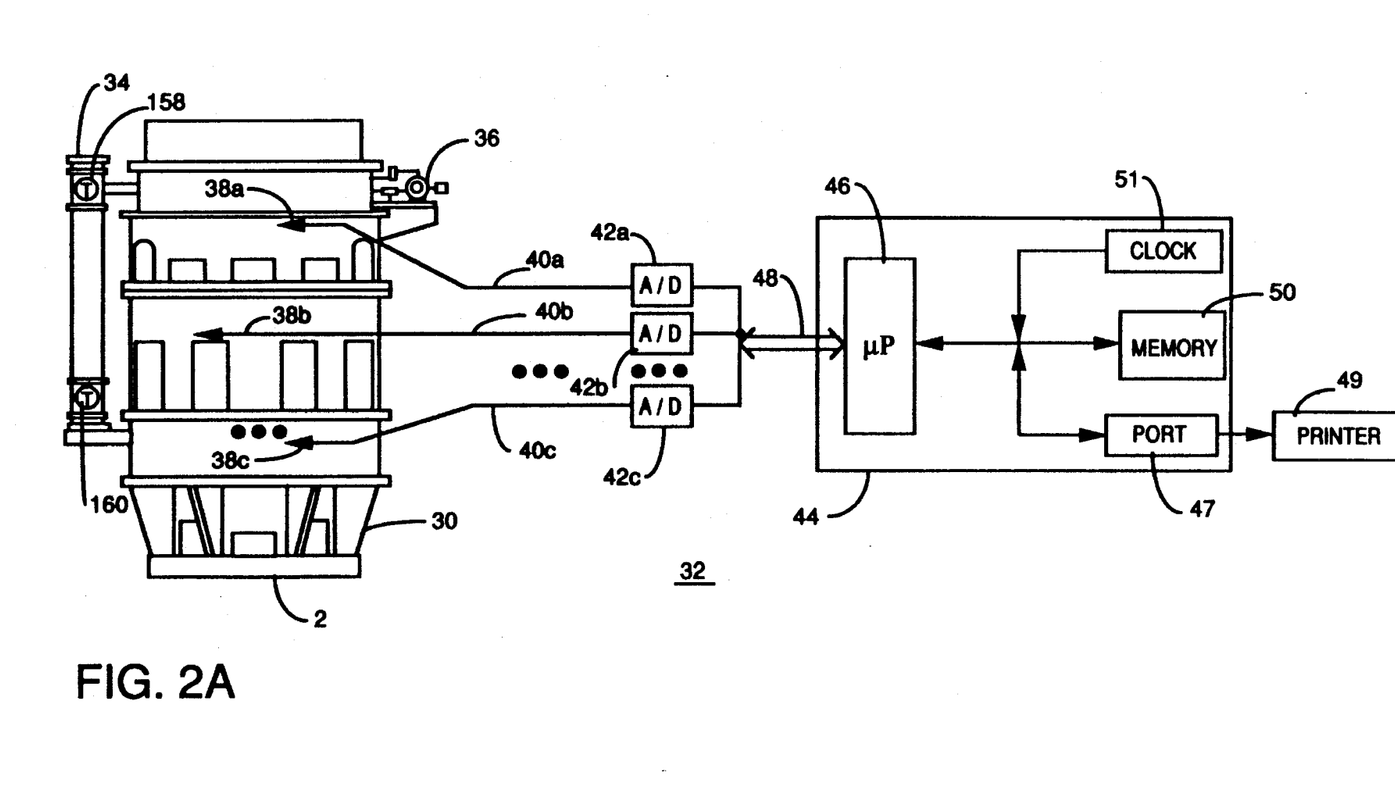
FIG. 2A is a block diagram of a system having a local processor for diagnosing various operating conditions of a motor.

Referring now to FIG. 2A, the RCP motor 2 further includes an upper bearing oil heat exchanger 34 and an oil lift system 36. The RCP motor 2 is interconnected with a diagnostic system 32 which includes a plurality of sensors 38a–38c, cables 40a–40c and analog to digital (A/D) converters 42a–42c. The system 32 also includes a processor 44. As will be described in detail below, the plural sensors 38 for the RCP motor 2 are positioned thereon and therein, in order to sense a plurality of operating conditions of the RCP motor 2. The sensors 38 are interconnected with the converters 42 by cables 40, such as the exemplary conventional twisted pair cables. Alternatively, coaxial cables, fiber optic cables or any other suitable interconnection may be provided. Each of the converters 42 converts an electrical signal (e.g., a voltage, a current, a resistance, etc. or an equivalent light beam) provided by a sensor 38 into a corresponding digital value for use by the processor 44.

The exemplary processor 44 includes a microprocessor 46, a port 47 having an attached printer 49, an input/output (I/O) bus 48, a random access memory (RAM) 50 and a real time clock 51. It being understood that the invention is applicable to any type of processor (e.g., a personal computer (PC), a mini-computer, a mainframe computer, or any other type of processing device), output device (e.g., a cathode ray tube (CRT), etc.), port or I/O bus (e.g., serial, RS-232, RS-422, parallel, VME, AT-bus, etc.), or memory (e.g., EEPROM, disk, etc.). As will be described in detail below, the microprocessor 46 uses the I/O bus 48 to read digital values, representative of the electrical signals from the corresponding sensors 38, from the A/D converters 42. The microprocessor 46 then stores the digital values in the memory 50 for later use in diagnosing the operability of the RCP motor 2. Those skilled in the art will recognize that the location of the exemplary processor 44 is generally within several hundred feet of the exemplary RCP motor 2, in order to accommodate the capabilities of the exemplary cables 40.

Figure 2B:
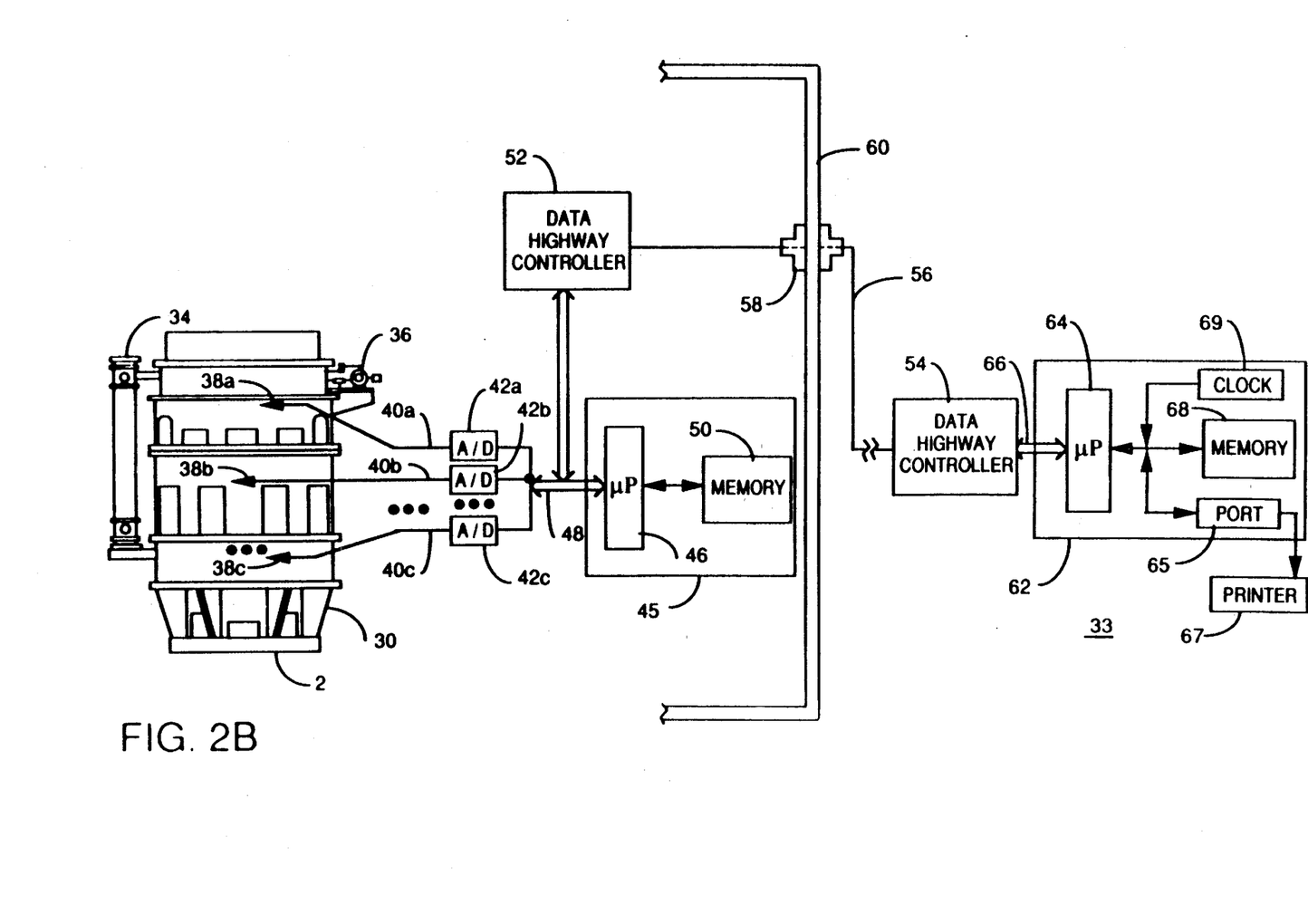
FIG. 2B is a block diagram of a system having an intermediate data storage device and a data highway for communicating various operating conditions of a motor to a remote diagnostic processor.

Referring now to FIG. 2B, the RCP motor 2 is interconnected by a local processor 45 with a remote diagnostic system 33. The remote diagnostic system 33 is interconnected with the local processor 45 by a local data highway controller 52 and a remote data highway controller 54. The operation of the exemplary processor 45 is generally the same as described above for the processor 44 (see FIG. 2A). As will be described below, the processor 45 provides intermediate data storage for the remote diagnostic system 33.

The controllers 52,54 are interconnected by a cable 56. It being understood that the invention is applicable to any type of data highway (e.g., a data acquisition network, a process control network, a wide area network, etc.) and any type of cable interconnection (e.g., a coaxial cable, a fiber optic cable, telephone lines, etc.). In the exemplary embodiment, the cable 56 passes through a bulkhead 58 (e.g., a bulkhead connector, a penetrator, etc.) at a barrier 60 (e.g., a biological barrier, a containment vessel, etc.). The controllers 52,54 provide a preselected periodic mapping of data specified by the remote diagnostic system 33 to and from the processor 45. The exemplary remote diagnostic system 33 has a processor 62 which is similar to the processor 44 (see FIG. 2A) and includes a microprocessor 64, a port 65 having an attached printer 67, an I/O bus 66, a RAM memory 68 and a real time clock 69. In a manner similar to the operation of the processor 44, the microprocessor 64 uses the I/O bus 66 to read digital values, representative of the electrical signals from the corresponding sensors 38, and stores the values in the memory 68. The principal difference between the system 33 and the system 32 (see FIG. 2A), being the intermediate data storage in the processor 45 and the intermediate data communication by the controllers 52,54.

Oil Lift System Condition Monitor

Figure 3:
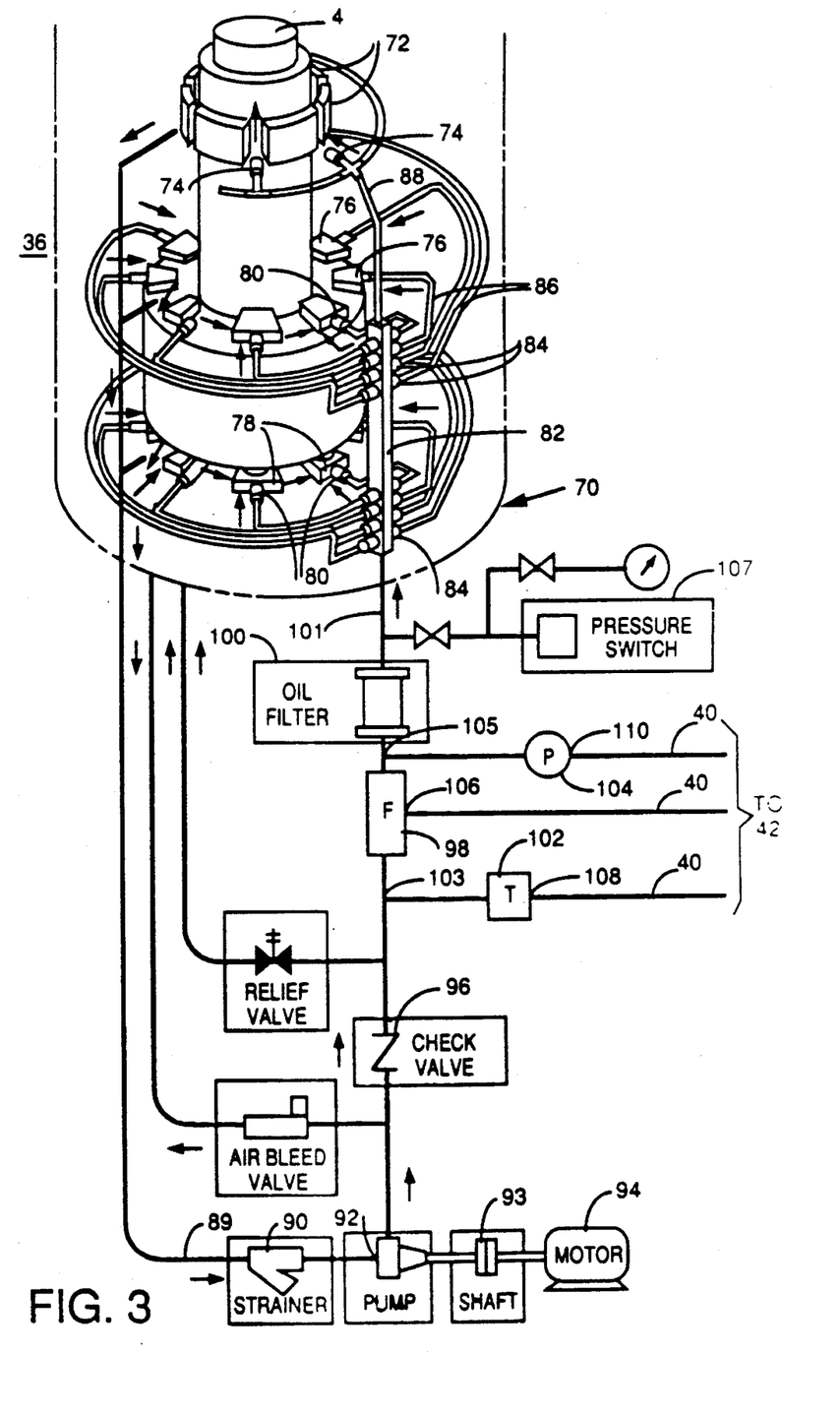
FIG. 3 is a block diagram of an oil lift system for a motor having diagnostic sensors.

Referring now to FIG. 3, the oil lift system 36 generally surrounds the shaft 4 and includes an upper oil reservoir 70 (shown in shadow), a plurality of upper guide bearing shoes 72, a plurality of guide bearing oil spray nozzles 74, a plurality of upper thrust bearing shoes 76 and a plurality of lower thrust bearing shoes 78. Each of the shoes 76,78 has an input check valve 80.

A high pressure manifold 82 has a plurality of flow controllers 84 which are each interconnected by an oil line 86 with a corresponding check valve 80. Each of the exemplary controllers 84 controls a flow of oil in the corresponding oil line 86 to the corresponding check valve 80 and limits the exemplary oil flow to approximately one quart of oil per minute. A separate oil line 88 connects the manifold 82 to the spray nozzles 74.

An oil line 89 provides a return path for recirculating oil from the oil reservoir 70 of the oil lift system 36. The oil line 89 connects the oil reservoir 70 with an oil strainer 90. The strained oil is recirculated by an oil pump 92 having a drive shaft 93 which is driven by a motor 94. The pump 92, in turn, pumps the oil through a check valve 96. Next, the recirculating oil passes through a flowmeter 98 and an oil filter 100. Finally, an oil line 101 provides an entrance path for the recirculating, filtered oil to reenter the manifold 82.

A temperature, flow and pressure of the recirculating oil are monitored, respectively, by exemplary diagnostic sensors which include a temperature detector 102 which is connected at an input 103 of the flowmeter 98, the flowmeter 98, and a pressure transducer 104 which is connected at an output 105 of the flowmeter 98. Alternatively, the diagnostic sensors may include the flowmeter 98 and the pressure transducer 104, but not the temperature detector 102. Each of the sensors 98,102,104 have outputs 106,108,110, respectively, which are connected by cables 40 to A/D converters 42 (see FIG. 2A). The outputs 106,108,110 provide electrical signals (e.g., 0 to +10 VDC, +4 to +20 mA, a variable resistance, etc. or an equivalent light beam) which correspond to a rate of oil flow between the input 103 and the output 105 of the flowmeter 98, an oil temperature at the input 103 of the flowmeter 98, and an oil pressure at the output 105 of the flowmeter 98, respectively. A pressure switch 107 ensures that there is adequate pressure in the oil line 101 during start-up of the RCP motor 2 (see FIG. 1).

Upper Thrust Bearing Condition Monitor

Figure 4:
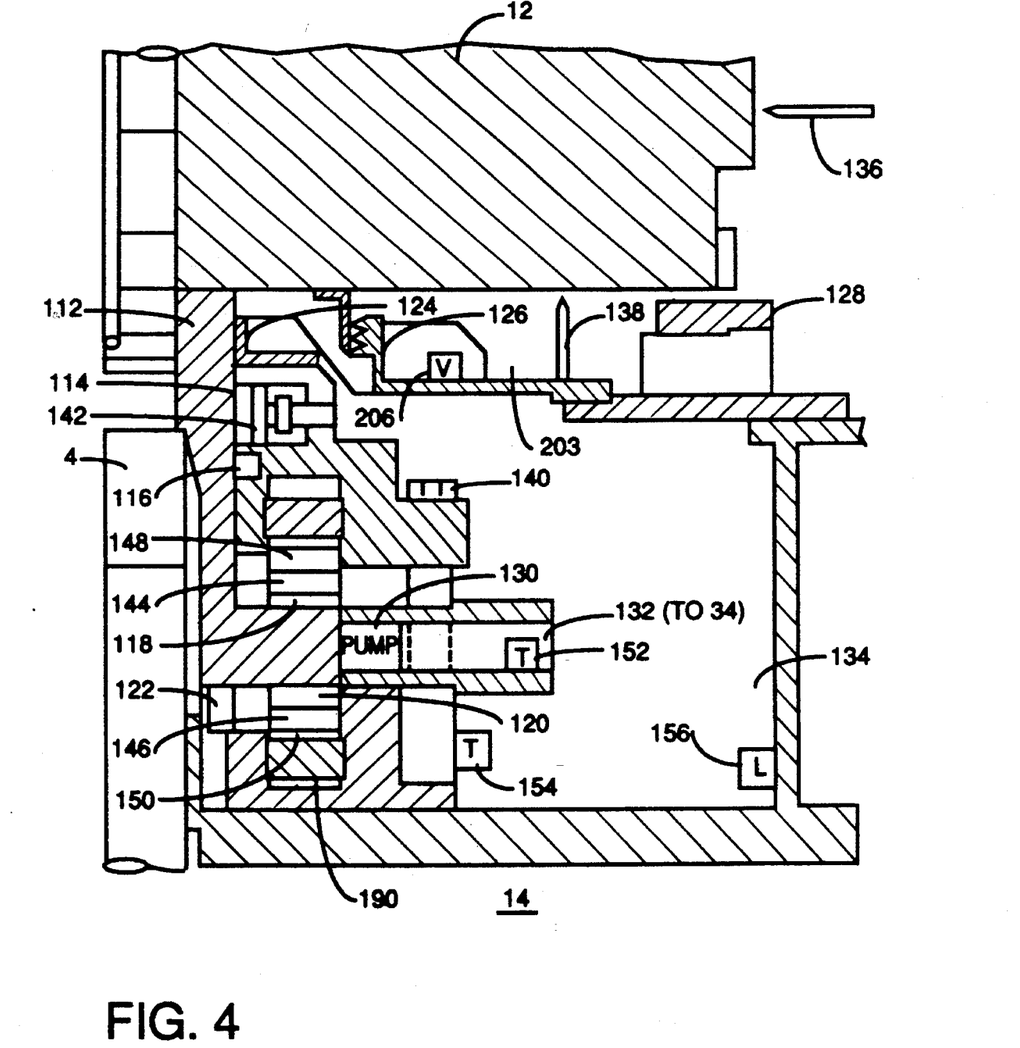
FIG. 4 is a cross-sectional view of an upper bearing assembly having diagnostic sensors.

FIG. 4 is a cross-sectional view of the upper bearing assembly 14. The assembly 14 includes a thrust runner 112 which is interconnected with the shaft 4, a guide bearing 114 for a vertical surface of the thrust runner 112, a guide bearing chamber seal 116, two thrust bearings 118,120 for two horizontal surfaces of the thrust runner 112, a runner seal 122, a guide bearing seal 124, a flywheel seal 126, a ratchet plate 128, a viscosity pump 130, a flow chamber 132 for connection to the upper bearing oil heat exchanger 34 (see FIG. 2A), and an oil bath 134.

The assembly 14 has a plurality of sensors which include a radial position proximity probe 136 for determining a radial position of the flywheel 12, an axial position proximity probe 138 for determining a vertical position of the flywheel 12, a thrust load cell 140 for determining a load on the upper thrust bearing 118, three RTD's 142,144,146 for determining a temperature of the guide bearing 114 and the thrust bearings 118,120, respectively. The exemplary assembly 14 further has two proximity probes 148,150 for respectively determining an orientation of the thrust bearing shoes 76,78 (see FIG. 3) of the thrust bearings 118,120, and a temperature sensor 152 for determining an oil temperature in the flow chamber 132 at an inlet of the oil heat exchanger 34 (see FIG. 2A). It being understood that alternative embodiments of the assembly 14 may eliminate the proximity probes 148,150 and the temperature sensor 152. The assembly 14 also has a temperature sensor 154 for determining an oil temperature in the oil bath 134, a level sensor 156 for determining an oil level in the oil bath 134, and two temperature sensors 158,160 (see FIG. 2A) for determining a water inlet temperature and a water outlet temperature, respectively, of the heat exchanger 34 (see FIG. 2A).

Those skilled in the art will recognize that, in a manner similar to the operation of the sensors 98,102,104 (see FIG. 3), the sensors 136–160 also have outputs (not shown) which are cabled to the plural A/D converters 42 (see FIG. 2A). The converters 42, in turn, provide digital values to the processor 44 (see FIG. 2A) which correspond to the electrical signals provided by the sensors 136–160. Alternatively, the processor 44 further includes software routines which calculate, for example, for the upper bearing assembly 14, values representative of an efficiency of the upper bearing oil heat exchanger 34 (see FIG. 2A), a load on the thrust bearings 118,120, a film thickness of oil on the thrust bearings 118,120, a maximum temperature of the bearings 114, 118,120, and various other parameters associated with oil lubrication.

Lower Guide Bearing Condition Monitor

Figure 5:
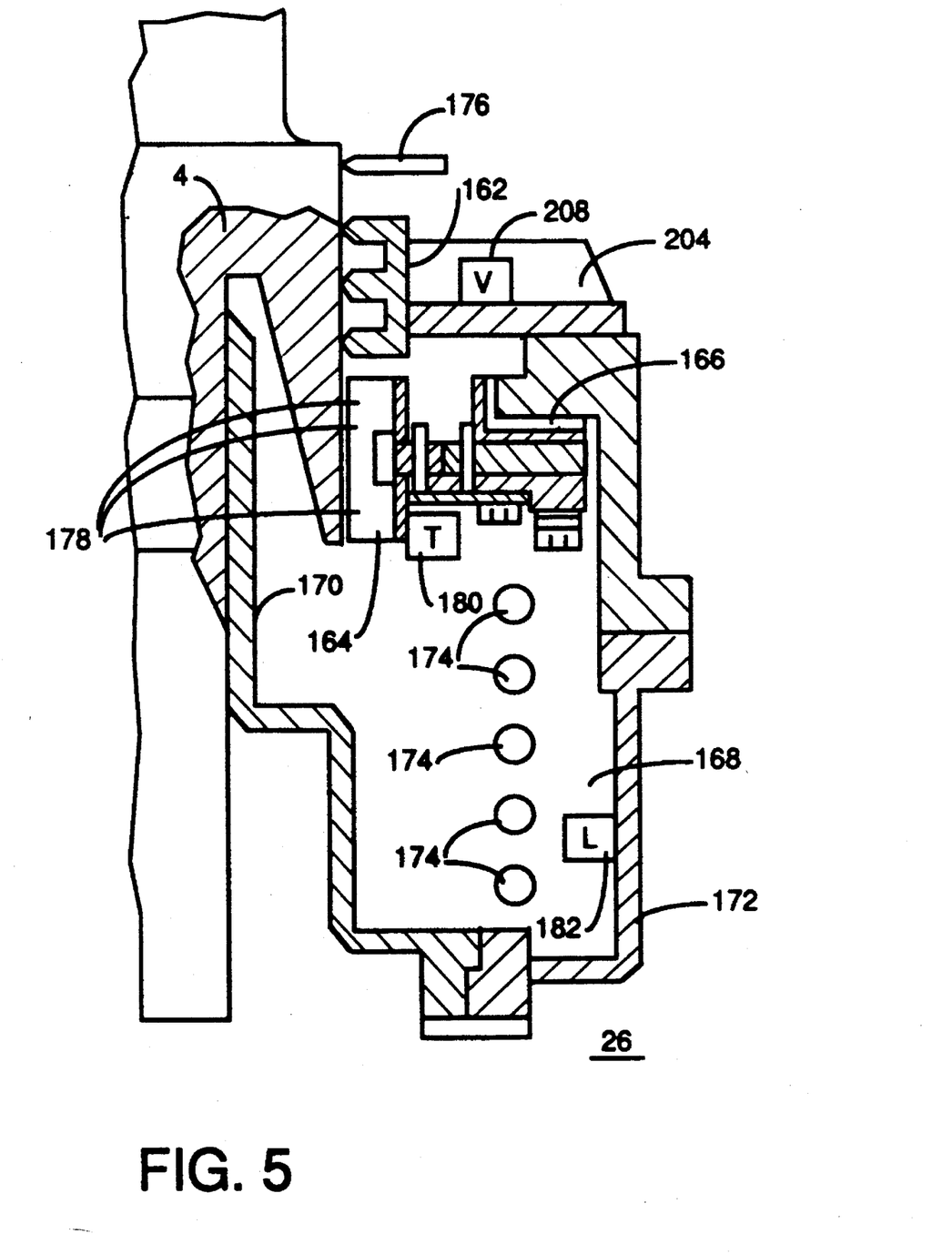
FIG. 5 is a cross-sectional view of a lower radial bearing assembly having diagnostic sensors.

FIG. 5 is a cross-sectional view of the lower radial bearing assembly 26. The assembly 26 includes a lower bearing seal 162, a lower guide bearing 164, a lower bearing insulator 166, and an oil bath 168 having a standpipe 170, an oil pan 172 and a plurality of cooling coils 174. The assembly 26 has a plurality of sensors which include a radial position proximity probe 176 for determining a radial position of the shaft 4, plural RTD's 178 which are located close to a bearing surface of the guide bearing 164 for determining a temperature of the guide bearing, a temperature sensor 180 for determining an oil temperature in the oil bath 168, and a level sensor 182 for determining an oil level in the oil bath 168.

Those skilled in the art will recognize that, in a manner similar to the operation of the sensors 98,102,104 (see FIG. 3), the sensors 176–182 also have outputs (not shown) which are cabled to the A/D converters 42 (see FIG. 2A). The converters 42, in turn, provide digital values to the processor 44 (see FIG. 2A) which correspond to the electrical signals provided by the sensors 176–182. Alternatively, the processor 44 further includes software routines which calculate, for example, for the lower bearing assembly 26, various conditions of the guide bearing 164 including clearance and alignment, an overall alignment of the RCP motor 2 (see FIG. 1) with the RCP (not shown), and various other parameters representative of oil lubrication. Alternatively, the processor 44 may also include software routines which calculate values representative of a maximum temperature of the guide bearing 164.

Bearing Insulation Resistance Monitor

Figure 6:
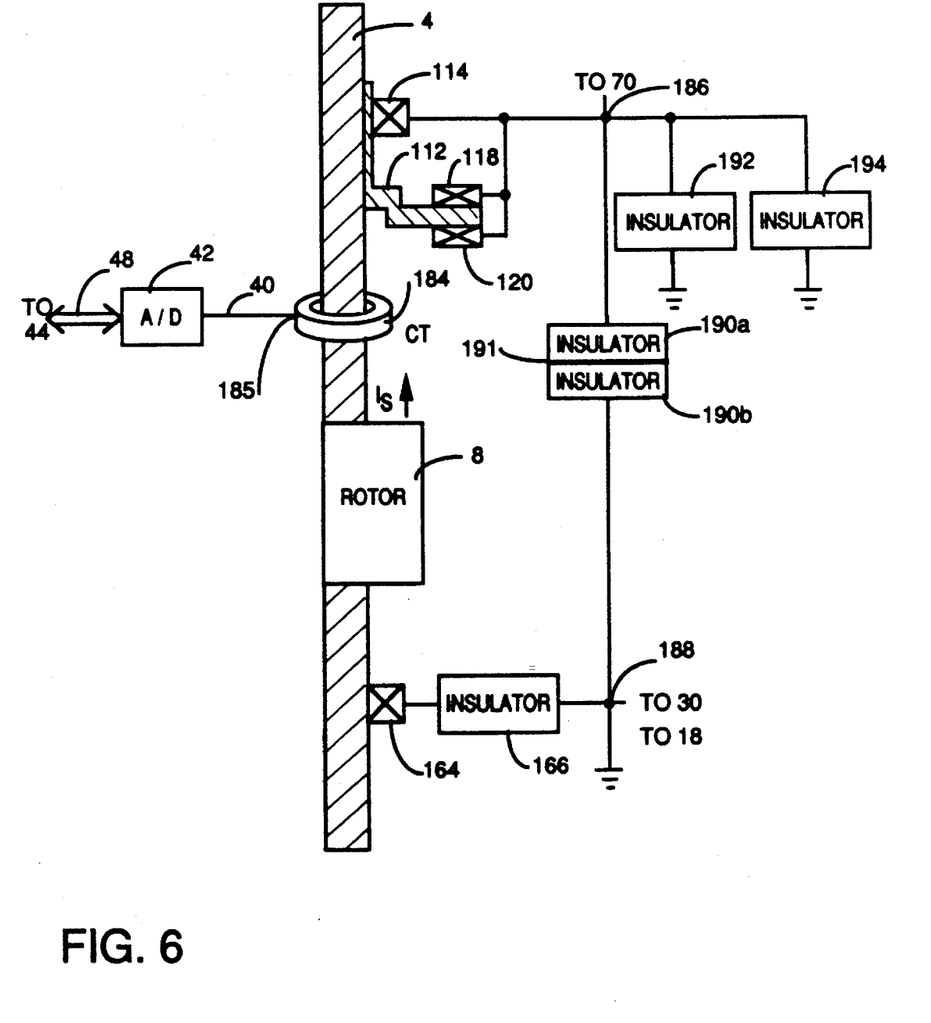
FIG. 6 is a partial block diagram and circuit diagram of a motor having a current transformer for diagnosing a condition of a plurality of bearing insulators.

Referring now to FIGS. 2A and 6, a current transformer (CT) 184 surrounds the rotating shaft 4 above the rotor 8. The CT 184 has an output 185 which is connected by the cable 40 to the corresponding A/D converter 42 and, in turn, to the I/O bus 48 of the processor 44 (see FIG. 2A). The CT 184 senses an alternating current Is which flows in the shaft 4. As discussed below, the processor 44 monitors the current sensed by CT 184, in order to diagnose the joint operability of three insulators 190,192,194.

Continuing to refer to FIG. 6, the thrust runner 112 of the shaft 4, as discussed above, rotates about the upper guide bearing 114 and the two thrust bearings 118,120. The shaft 4 also rotates about the lower guide bearing 164. The upper bearings 114,118,120 are electrically connected at node 186 to the upper oil reservoir 70 (see FIG. 3). The exemplary lower bearing 164 is electrically insulated from a node 188 by the lower bearing insulator 166. Alternatively, the insulator 166 is not provided and the lower bearing 164 is electrically connected to the node 188. Regardless, under normal operation of the RCP motor 2 (see FIG. 1), a housing of the RCP (not shown) electrically connects the lower bearing 164 to the node 188. Accordingly, this shunts any direct current flow and, thus, protects the upper bearings 114,118,120 from any damage caused by direct current flow in the shaft 4.

The node 188 is electrically connected to the stator 18 (see FIG. 1) and is grounded to the housing 30 of the RCP motor 2 (see FIG. 1). The exemplary bearings 114,118,120,164 are separated from the shaft 4 by a corresponding oil film of approximately 0.005 inch thickness. Accordingly, those skilled in the art will recognize that the bearings 114,118, 120,164 are electrically connected, in both a resistive and a capacitive manner, to the shaft 4 by the corresponding oil film.

An upper bearing electrical insulator 190 includes two layers of insulation 190a,190b which are internally connected at an internal node 191. The insulator 190 insulates the node 186 and the upper oil reservoir 70 (see FIG. 3) from the ground at node 188. Similarly, a plurality of insulators, such as the exemplary two insulators 192,194, also insulate the node 186 and the upper oil reservoir 70 from the ground at node 188.

Under normal operation of the RCP motor 2 (see FIG. 1) the insulators 190,192,194 substantially electrically insulate the rotating shaft 4 and the bearings 114,118,120 from the RCP motor housing 30 (see FIG. 1) and the stator 18 (see FIG. 1). In this manner, the insulators 190,192,194 substantially eliminate any current flowing in the motor shaft 4 and, therefore, any current flowing through the bearings 114,118, 120. Accordingly, an increase in the alternating current is above a predetermined baseline value indicates a degradation of the insulators 190,192,194 (i.e., a corresponding increase in alternating current flowing through the insulators) of the upper bearing assembly 14. Those skilled in the art will appreciate that a degradation of the insulator 166 of the lower radial bearing assembly 26 (see FIG. 5) cannot normally be monitored because the housing of the RCP (not shown) effectively shorts the lower guide bearing 164 to the node 188.

Labyrinth Seal Condition Monitor

Referring again to FIGS. 4 and 5, the upper bearing assembly 14 includes the flywheel seal 126 which, under normal operation prevents oil residue and oil vapor from entering a labyrinth section 203. Similarly, the lower radial bearing assembly 26 includes the lower bearing seal 162, which, under normal operation prevents oil residue and oil vapor from entering a labyrinth section 204. Two hydrocarbon vapor sensors 206,208 are positioned in the labyrinth sections 203,204, respectively. The sensors 206,208 effectively monitor the condition of the labyrinth seals 126,162 during normal motor operation. Oil residue or oil vapor may enter the labyrinth sections 203,204, for example, if there is a deformation of the fins of the seals 126,162, or if a seal clearance (e.g., 0.009 to 0.012 inch in the exemplary embodiment) increases.

Those skilled in the art will recognize that, in a manner similar to the operation of the sensors 98,102,104 (see FIG. 3), the sensors 206,208 also have outputs (not shown) which are cabled to the A/D converters 42 (see FIG. 2A). The converters 42, in turn, provide digital values to the processor 44 (see FIG. 2A) which correspond to the electrical signals provided by the sensors 206,208.

Software Routines

Figure 7A:
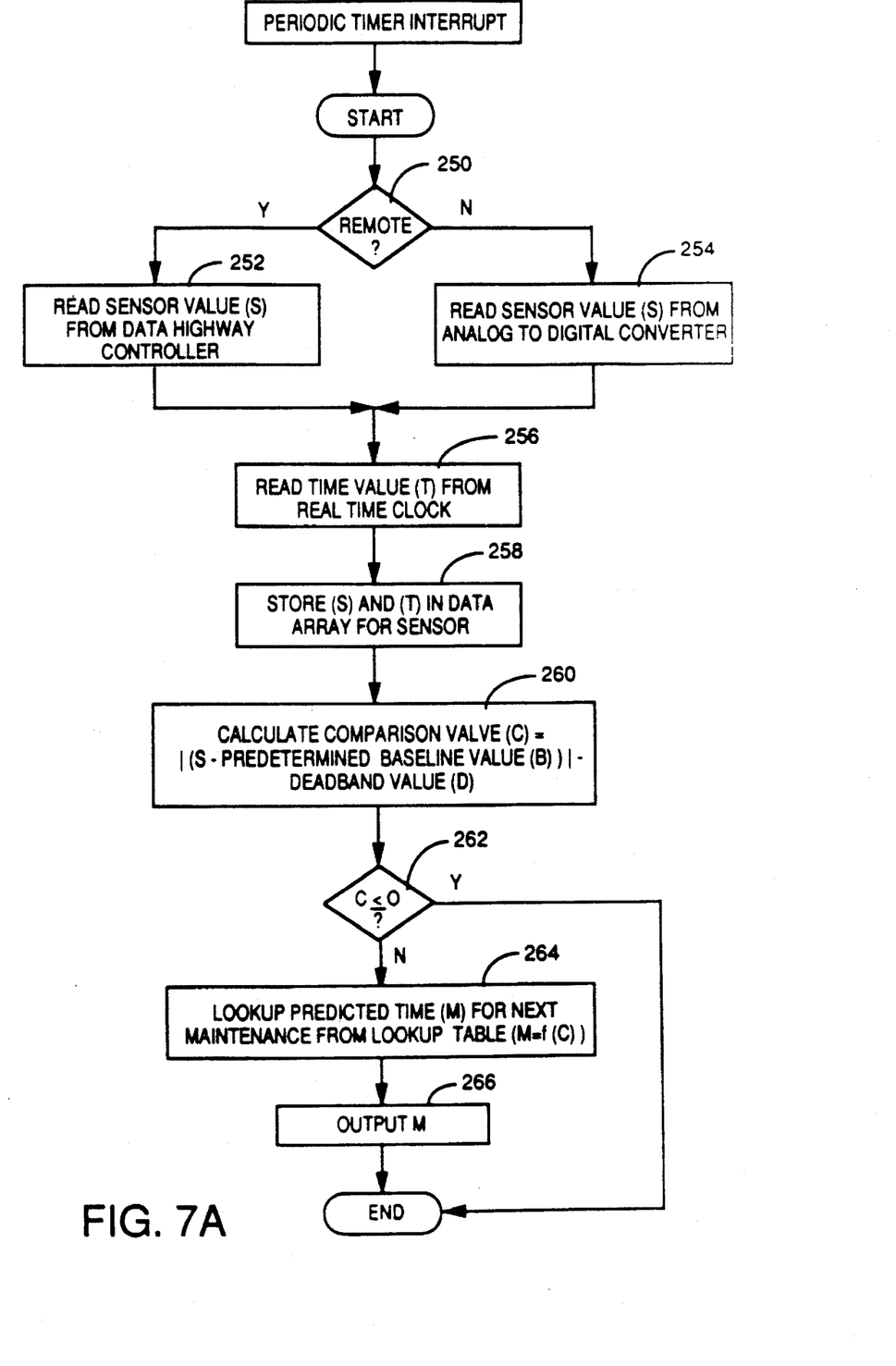
FIGS. 7A–7B are flowcharts of software routines executed by a processor, in order to perform motor data collection, trending and diagnosis.
Figure 7B:
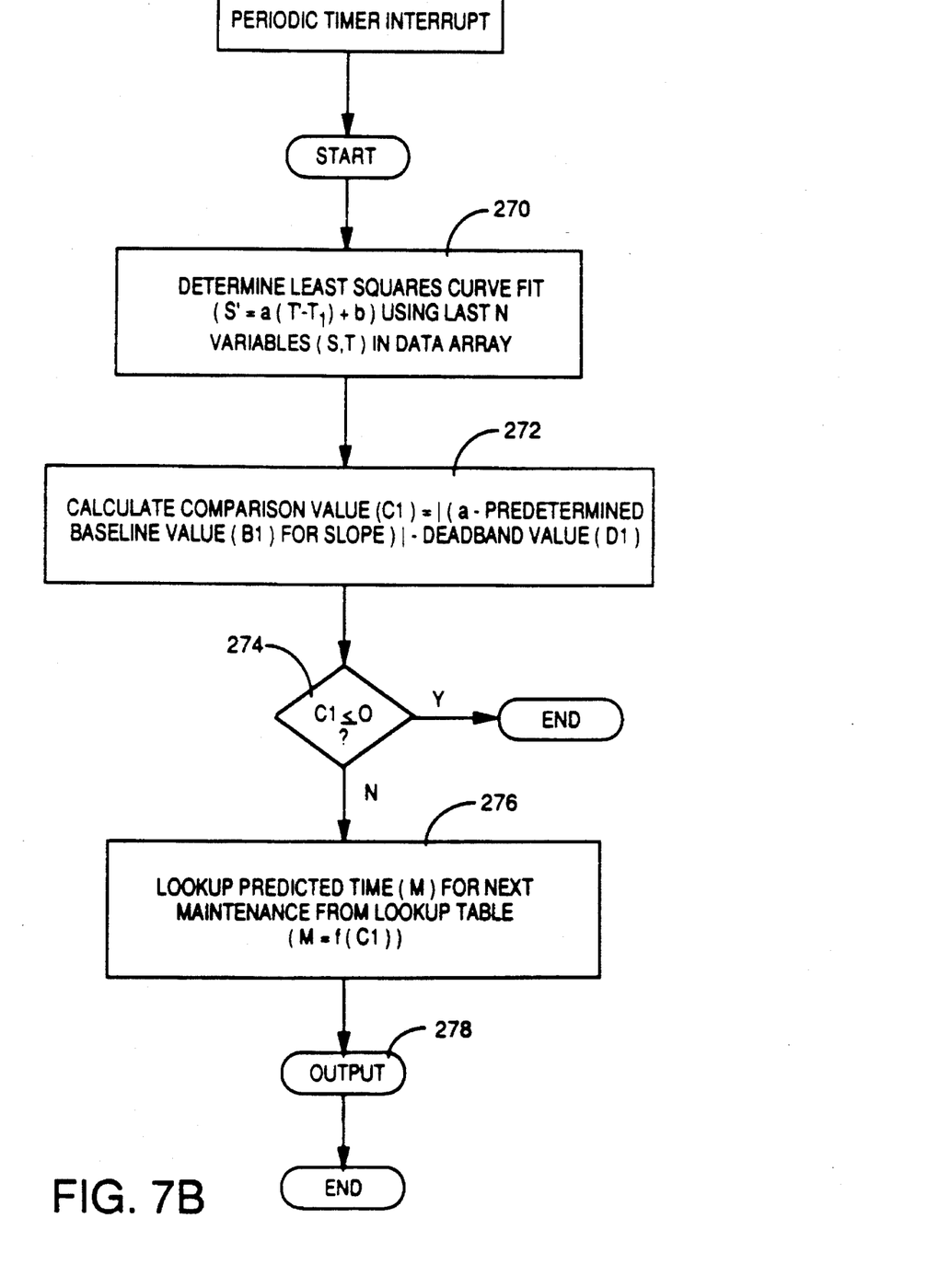

FIGS. 7A–7B are flowcharts of software routines executed by the exemplary processor 44 (see FIG. 2A), in order to perform data collection, data trending and diagnosis of an individual sensed value, or a derivative thereof. Referring to FIGS. 2A–2B and 7A, the routine begins in response to a periodic timer interrupt of the clock 51. A test at step 250 examines a configuration flag (REMOTE) stored in memory 50 in order to determine whether a sensed value (S) is read from the local A/D converters 42 or from the data highway controller 54. If a remote value is used, then such value is read from the data highway controller 54 at step 252. On the other hand, if a local value is used, then such value is read from the A/D converter 42 at step 254. In either case, at step 256, a time value (T) is read from the real time clock 51. At step 258 the time value (T) and the sensed value (S), obtained at either step 252 or 254, are stored in a data array in the memory 50. Then, at step 260, a comparison value (C) is determined as a function of three variables: S, a predetermined baseline value (B), and a predetermined deadband value (D). The exemplary predetermined values B,D are stored in the memory 50 and are determined from baseline or calibration values for a particular parameter of RCP motor 2. Alternatively, the predetermined values B,D may be determined from other sensed parameters of the RCP motor 2. The value of the predetermined deadband value (D) may be zero. An Equation for C is provided by:

$$C = |(S-B)| - D \qquad \text{Eq. (1)}$$

At step 262, if C is less than or equal to zero, which indicates that the sensed value (S) is within an acceptable predetermined range for a new or newly refurbished motor, the routine exits. Otherwise, if C is positive, the processor 44, at step 264, uses C to index a lookup table in memory 50 and determine a predicted time (M) of operability of the RCP motor 2 before motor maintenance or inspection is required. Alternatively, the lookup table may indicate that motor maintenance or inspection is required during the next scheduled outage. Finally, at step 266, the exemplary processor 44 uses port 47 and outputs a report to printer 49. The report includes an identification of the sensed parameter (S) and the predicted time (M). Alternatively, the report indicates that motor maintenance or inspection is required during the next scheduled outage.

Referring now to FIGS. 2A–2B and 7B, FIG. 7B is a flowchart of a software routine which calculates a derivative of the sensed values (S) from the data array of FIG. 7A, in order to diagnose a period of operability of the RCP motor 2. The routine begins in response to a periodic timer interrupt of the clock 51. At step 270, the processor 44 determines a least squares linear approximation using the last N sets of variables (S ,T) in the data array which is updated by the routine of FIG. 7A. An Equation for the linear approximation is:

$$S' = a(T' - T_1) + b \qquad \text{Eq. (2)}$$

where:

a: is a slope which represents a derivative, dS/dt;

b: is a value of S' at a time $T_1$ of a first sample in the array; and $T_1$: is a time corresponding to the first sample in the array.

Equations for "a" and "b" are:

$$a = \frac{(N)(\Sigma[(Ti - T_1)(Si)]) - (\Sigma[Ti - T_1])(\Sigma[Si])}{(N)(\Sigma[(Ti - T_1)^2]) - (\Sigma[Ti - T_1])^2} \qquad \text{Eq. (3a)}$$

$$b = \frac{\Sigma[Si]}{N} - (a)\frac{\Sigma[Ti - T_1]}{N} \qquad \text{Eq. (3b)}$$

where:

N: is 100 in the exemplary embodiment;

Ti: ranges from $T_1$ to $T_N$; and

Si: ranges from $S_1$ to $S_N$.

Then, at step 272, a comparison value (C1) is determined as a function of three variables: "a", a predetermined baseline value (B1), and a predetermined deadband value (D1). The predetermined values B1,D1 are stored in the memory 50 and are determined from baseline or calibration values for a particular parameter of RCP motor 2. Alternatively, the predetermined values B1,D1 may be determined from other sensed parameters of the RCP motor 2. The value of the predetermined deadband value (D1) may be zero. An Equation for C1 is provided by:

$$C1 = |(a - B1)| - D1 \qquad \text{Eq. (4)}$$

At step 274, if C1 is less than or equal to zero, which indicates that the derivative "a" of the sensed value (S) is within an acceptable predetermined range for a new or newly refurbished motor, the routine exits. Otherwise, if C1 is positive, the processor 44, at step 276, uses C1 to index a lookup table in memory 50 and determine a predicted time (M) of operability of the RCP motor 2 before motor maintenance or inspection is required. Alternatively, the lookup table may indicate that motor maintenance or inspection is required during the next scheduled outage. Finally, at step 278, the processor 44 uses port 47 and outputs a report to printer 49. The report includes an identification of the sensed parameter (S), the derivative (a) and the predicted time (M). Alternatively, the report indicates that motor maintenance or inspection is required during the next scheduled outage.

Alternatively, in selected RCP motor 2 subsystems, the predicted time (M) of operability of the RCP motor 2 may be calculated from one or both of the following Equations:

$$M = (T_M)\frac{|(S_N - S_M)|}{|(S_0 - S_M)|} \qquad \text{Eq. (5a)}$$

$$M = dt = dS/a = |(S_N - S_M)|/a \qquad \text{Eq. (5b)}$$

where:

$T_M$: is a typical maintenance interval, after manufacture or refurbishment, for the RCP motor 2;

$S_N$: is a current sensed value;

$S_M$: is a minimum acceptable sensed value; and $S_O$: is a typical sensed value, after manufacture or refurbishment, of the RCP motor 2.

The above described software routines compare a single sensed value, or a derivative of the sensed value, with a predetermined value. It being understood that the invention is applicable to multiple sensed values having multiple predetermined values. Referring now to FIGS. 2A and 3, an example of a subsystem utilizing multiple values is the oil lift system 36. In the exemplary oil lift system 36, as discussed above with FIG. 3, the rate of oil flow provided by the flowmeter 98 is corrected based on the oil temperature provided by the temperature detector 102. The rate of oil flow is well-known as a direct function of oil temperature. The exemplary processor 44 uses the sensed temperature to index a lookup table in memory 50 and determine a correction factor for the sensed oil flow. The processor 44 then multiplies the sensed oil flow by the correction factor, in order to obtain a corrected oil flow value at a standard temperature. Alternatively, as discussed above, no temperature correction of the oil flow is provided.

Regardless of whether temperature correction of the oil flow is provided, an indication of an oil line problem is provided by a step change in the oil flow sensed by the flowmeter 98, a step change in the oil pressure sensed by the pressure transducer 104, or by step changes in both the oil flow and the oil pressure. An indication of an oil leak (e.g., a cracked or broken oil line) is provided by a step increase in the oil flow and a step decrease in the oil pressure. Similarly, an indication of an oil line blockage is provided by a step decrease in the oil flow. In either case of a breakage or a blockage, the sensed pressure and sensed flow must be outside of the corresponding acceptable predetermined range for a new or newly refurbished motor. The predicted time (M) for motor maintenance, in either case, is determined from a minimum of the individual times determined by pressure and flow. Furthermore, the above described report also includes an identification of whether there was a breakage or a blockage.

Continuing to refer to FIG. 3, an overall condition of the oil lift system 36, such as an oil line blockage or breakage, may also be determined. Expected changes in oil flow and oil pressure are empirically predetermined for various conditions of the oil lift system 36. These predetermined changes include an expected flow change ($F_T$) for a blocked oil line (e.g., line 86), an expected flow change ($F_S$) for two or more blocked spray nozzles (e.g., nozzles 74), an expected flow change ($F_O$) for an open oil line (e.g., line 86), and an expected pressure change ($P_O$) for an open oil line (e.g., line 86). Baseline values ($B_F, B_P, B_T$) and deadband values ($D_F, D_P, D_T$) are also empirically determined for sensed oil flow, oil pressure and oil temperature ($S_F, S_P, S_T$) from the corresponding sensors 98,104,102, respectively.

A breakage condition, such as a completely open or broken oil line (e.g., line 86 or line 88) is generally indicated whenever sensed oil flow ($S_F$) exceeds the sum of the flow baseline and deadband values (i.e., $B_F+D_F$) and whenever sensed pressure ($S_P$) is less than the difference of the pressure baseline and deadband values (i.e., $B_P-D_P$).

Alternatively, whenever sensed pressure ($S_P$) is within the pressure deadband range of the pressure baseline (i.e., $(B_P-D_P) \leq S_P \leq (B_P+D_P)$), then the possibility of a blocked condition is examined. In this case, whenever the sensed oil flow ($S_F$) is less than the difference of the flow baseline and the expected flow change ($F_T$) for a blocked oil line (i.e., $S_F<(B_F-F_T)$), a blockage of a shoe oil line (e.g., line 86) is indicated. Similarly, whenever the sensed oil flow ($S_F$ is less than the difference of the flow baseline and the expected flow change ($F_S$) for multiple blocked spray nozzle lines (i.e., $S_F<(B_F-F_S)$), a blockage of two or more spray nozzles (e.g., nozzles 74) is indicated.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed:

1. An online system for diagnosing operability of a rotating electrical power conversion apparatus, said system comprising:

sensing means for sensing at least one operating condition of said rotating electrical power conversion apparatus and producing a corresponding at least one electrical variable;

data conversion means for converting the at least one electrical variable to a corresponding at least one value;

comparison means for comparing the at least one value to a corresponding at least one predetermined baseline value of said rotating electrical power conversion apparatus and producing a corresponding at least one comparison value; and signalling means for outputting at least one signal related to a period of predicted operability of said rotating electrical power conversion apparatus whenever the at least one comparison value exceeds a corresponding at least one predetermined deadband value.

2. The system as recited in claim 1, wherein the at least one predetermined deadband value is zero.

3. The system as recited in claim 1, wherein the operating condition of said rotating electrical power conversion apparatus is a non-electrical operating condition.

4. The system as recited in claim 3, wherein said rotating electrical power conversion apparatus has an oil lubrication system and the non-electrical operating condition is a condition of the oil lubrication system.

5. The system as recited in claim 4, wherein said sensing means is an oil vapor analyzer.

6. The system as recited in claim 4, wherein said sensing means includes flow sensing means for directly sensing a rate of oil flow and pressure sensing means for sensing an oil pressure.

7. The system as recited in claim 6, wherein said sensing means further includes temperature sensing means for sensing an oil temperature.

8. The system as recited in claim 6, wherein said signalling means outputs a first signal related to a blockage of the oil lubrication system and a second signal related to a breakage of the oil lubrication system.

9. The system as recited in claim 7, wherein said comparison means includes data correction means for correcting a value corresponding to the rate of oil flow as a function of a value corresponding to the oil temperature.

10. The system as recited in claim 3, wherein said rotating electrical power conversion apparatus has a bearing and the non-electrical operating condition is a condition of the bearing.

11. The system as recited in claim 10, wherein said rotating electrical power conversion apparatus has a flywheel and said sensing means is a radial position proximity probe for the flywheel.

12. The system as recited in claim 10, wherein said rotating electrical power conversion apparatus has a flywheel and said sensing means is an axial position proximity probe for the flywheel.

13. The system as recited in claim 10, wherein said rotating electrical power conversion apparatus has a thrust bearing and said sensing means is a load cell for the thrust bearing.

14. The system as recited in claim 10, wherein said rotating electrical power conversion apparatus has a thrust bearing and said sensing means is an RTD for the thrust bearing.

15. The system as recited in claim 10, wherein said rotating electrical power conversion apparatus has a thrust bearing shoe and said sensing means is a proximity probe for the thrust bearing shoe.

16. The system as recited in claim 10, wherein said rotating electrical power conversion apparatus has a thrust bearing shoe and said sensing means includes at least two proximity probes for determining an orientation of the thrust bearing shoe.

17. The system as recited in claim 10, wherein said rotating electrical apparatus has a heat exchanger and said sensing means includes a water inlet temperature sensor and a water outlet temperature sensor for determining a temperature of the heat exchanger.

18. The system as recited in claim 10, wherein said rotating electrical power conversion apparatus has a heat exchanger and said sensing means is an oil inlet temperature sensor for the heat exchanger.

19. The system as recited in claim 10, wherein said rotating electrical power conversion apparatus has an oil bath and said sensing means includes an oil temperature sensor and an oil level sensor for the oil bath.

20. An online system for diagnosing operability of a rotating electrical power conversion apparatus, said system comprising:

sensing means for sensing at least one electrical insulation non-thermal parameter of said rotating electrical power conversion apparatus during operation thereof and producing a corresponding at least one electrical variable;

data conversion means for converting the at least one electrical variable to a corresponding at least one value;

comparison means for comparing the at least one value to a corresponding at least one predetermined baseline value of said rotating electrical power conversion apparatus and producing a corresponding at least one comparison value; and signalling means for outputting at least one signal related to a period of predicted operability of said rotating electrical power conversion apparatus whenever the at least one comparison value exceeds a corresponding at least one predetermined deadband value.

21. The system as recited in claim 20, wherein said rotating electrical power conversion apparatus has a bearing and the electrical insulation is an insulator for the bearing.

22. The system as recited in claim 21, wherein said sensing means is a current transformer for sensing a current passing through the insulator for the bearing.

23. The system as recited in claim 22, wherein said rotating electrical power conversion apparatus includes a rotating shaft and a stator, the bearing electrically contacting the rotating shaft, the insulator electrically insulating the rotating shaft and the bearing from the stator, and the current transformer sensing a current flowing in the rotating shaft, in order to diagnose a period of predicted operability of the insulator.

24. The system as recited in claim 20, wherein the at least one predetermined deadband value is zero.

25. An online system for diagnosing operability of a motor operating in a hazardous environment, said system comprising:

sensing means for sensing an operating condition of said motor and producing an electrical variable;

data conversion means for converting the electrical variable to a sensed value;

data processing means for processing the sensed value, said data processing means including comparison means for comparing the sensed value to a predetermined baseline value of said motor and producing a comparison value, and signalling means for outputting a signal related to a period of predicted operability of said motor in response to the comparison value.

26. The system as recited in claim 25 wherein said data processing means further includes data storage means for intermediate storage of the sensed value, and data communication means for communicating the sensed value from the data storage means to the comparison means, said comparison means and said signalling means being remotely located from said motor.

27. The system as recited in claim 26 wherein said data processing means further includes trending means for recording the sensed value with respect to a time value and producing a trended variable with respect to time, and determining means for evaluating the trended variable and determining a trend value.

28. The system as recited in claim 27, wherein the trend value is a derivative of the trended variable.

29. An online system for diagnosing operability of a reactor coolant pump (RCP) motor operating in a nuclear containment vessel, said system comprising:

sensing means for sensing an operating condition of said RCP motor and producing a corresponding electrical variable;

dam conversion means for converting the electrical variable to a corresponding value;

comparison means for comparing the value to a predetermined baseline value of said RCP motor and producing a corresponding comparison value; and signalling means for outputting a signal related to a period of predicted operability of said RCP motor in response to the comparison value.

30. A method for diagnosing operability of a rotating electrical power conversion apparatus, said method comprising:

sensing an operating condition of said rotating electrical power conversion apparatus and producing a corresponding electrical variable;

convening the electrical variable to a corresponding value;

comparing the value to a predetermined baseline value of said rotating electrical power conversion apparatus and producing a corresponding comparison value; and outputting a signal related to a period of predicted operability of said rotating electrical power conversion apparatus in response to the comparison value.

31. An online system for diagnosing operability of a motor with a bearing insulator operating in a hazardous environment, said system comprising:

sensing means for sensing an electrical parameter of the bearing insulator during operation of said motor and producing a corresponding electrical variable;

data conversion means for converting the electrical variable to a corresponding value;

comparison means for comparing the value to a predetermined baseline value of said motor and producing a corresponding comparison value; and signalling means for outputting a signal related to a period of predicted operability of said motor in response to the comparison value.

32. An online system for diagnosing operability of a reactor coolant pump (RCP) motor with a bearing insulator operating in a nuclear containment vessel, said system comprising:

sensing means for sensing an electrical parameter of the bearing insulator during operation of said RCP motor and producing a corresponding electrical variable;

data conversion means for converting the electrical variable to a corresponding value;

comparison means for comparing the value to a predetermined baseline value of said RCP motor and producing a corresponding comparison value; and signalling means for outputting a signal related to a period of predicted operability of said RCP motor in response to the comparison value.

33. A method for diagnosing operability of a rotating electrical power conversion apparatus having a bearing insulator, said method comprising:

sensing an electrical parameter of the bearing insulator during operation of said rotating electrical power conversion apparatus and producing a corresponding electrical variable;

converting the electrical variable to a corresponding value;

comparing the value to a predetermined baseline value of said rotating electrical power conversion apparatus and producing a corresponding comparison value; and outputting a signal related to a period of predicted operability of said rotating electrical power conversion apparatus in response to the comparison value.

* * * * *